United States Patent
Martens et al.

(10) Patent No.: US 10,090,852 B2
(45) Date of Patent: Oct. 2, 2018

(54) INPUT CIRCUIT FOR A DYNAMIC COMPARATOR

(71) Applicant: IMEC VZW, Leuven (BE)

(72) Inventors: Ewout Martens, Heverlee (BE);
Benjamin Hershberg, Leuven (BE);
Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/826,668

(22) Filed: Nov. 29, 2017

(65) Prior Publication Data

US 2018/0159549 A1    Jun. 7, 2018

(30) Foreign Application Priority Data

Dec. 1, 2016    (EP) .................................... 16201696

(51) Int. Cl.

| H03M 1/34 | (2006.01) |
| H03M 1/38 | (2006.01) |
| H03H 19/00 | (2006.01) |
| H03K 5/24 | (2006.01) |
| H03F 3/45 | (2006.01) |
| H03M 1/36 | (2006.01) |

(52) U.S. Cl.
CPC .......... *H03M 1/38* (2013.01); *H03F 3/45179* (2013.01); *H03H 19/004* (2013.01); *H03K 5/2481* (2013.01); *H03M 1/361* (2013.01)

(58) Field of Classification Search
CPC ...... H03F 3/45179; H03F 1/303; H03M 1/38; H03M 1/361
USPC ......................................... 341/155, 158, 143
See application file for complete search history.

(56) References Cited

U.S. PATENT DOCUMENTS

| 6,542,019 | B1 * | 4/2003 | Lim ..................... H03D 7/1441 |
| | | | 327/359 |
| 9,236,855 | B2 | 1/2016 | Shu |
| 9,281,785 | B2 * | 3/2016 | Sjoland ................... H03F 1/303 |
| 9,853,615 | B2 * | 12/2017 | Akter .................. H03F 3/45179 |
| 2016/0134293 | A1 * | 5/2016 | Dai ....................... H03H 11/481 |
| | | | 341/118 |

(Continued)

OTHER PUBLICATIONS

European Search Report, European Patent Application No. 16201696.8, dated Jun. 2, 2017, 9 pages.

(Continued)

*Primary Examiner* — Peguy Jean Pierre
(74) *Attorney, Agent, or Firm* — McDonnell Boehnen Hulbert & Berghoff LLP

(57) ABSTRACT

The present disclosure relates to an input circuit comprising positive and negative branches, each branch comprising a transistor arranged for receiving an input voltage at its gate terminal and a first fixed voltage at its drain terminal via a first switch characterized in that the source terminal of the transistor in each of the positive branch and the negative branch is connectable via a second switch to a first plate of a first capacitor in the positive branch and of a second capacitor in the negative branch, respectively, with a second plate of the first capacitor and of the second capacitor being connected to a second fixed voltage and the input circuit further being arranged for receiving a first reset voltage on the first plate of the first capacitor in the positive branch and a second reset voltage on the first plate of the second capacitor in the negative branch.

20 Claims, 10 Drawing Sheets

(56) References Cited

U.S. PATENT DOCUMENTS

2018/0083573 A1\* 3/2018 Broussev ............ H03B 5/1228

OTHER PUBLICATIONS

Chen, Yong et al., "Comparator With Built-In Reference Voltage Generation and Split-ROM Encoder for a High-Speed Flash ADC", 2015 International Symposium on Signals, Circuits and Systems, Jul. 10, 2015, pp. 1-4.

Miyahara, Masaya et al., "A Low-Offset Latched Comparator Using Zero-Static Power Dynamic Offset Cancellation Technique", IEEE Asian Solid-State Circuits Conference, Nov. 16-18, 2009, pp. 233-236.

Rabuske, Taimur et al., "Comparator-Based Binary Search ADC Architectures for UWB Receivers", Analog Integr. Circ. Sig. Process, vol. 77, 2013, pp. 471-482.

Nuzzo, Pierluigi et al., "Noise Analysis of Regenerative Comparators for Reconfigurable ADC Architectures", IEEE Transactions on Circuits and Systems—Regular Papers, vol. 55, No. 6, Jul. 2008, pp. 1441-1454.

Schinkel, Daniel et al., "A Double-Tail Latch-Type Voltage Sense Amplifier with 18ps Setup+Hold Time", ISSCC 2007, Session 17, Analog Techniques and PLLs, 17.7, 2007 IEEE International Solid-State Circuits Conference, Feb. 13, 2007, pp. 314-315 and 605.

Lewis, Stephen H. et al., "A Pipelined 5-Msample/s 9-bit Analog-to-Digital Converter", IEEE Journal of Solid-State Circuits, vol. 22, No. 6, Dec. 1987, pp. 954-961.

Katyal, Vipul et al., "A New High Precision Low Offset Dynamic Comparator for High Resolution High Speed ADCs", Circuits and Systems, APCCAS, 2006, pp. 5-8.

Sumanen, Lauri et al., "A 10-bit 200-MS/s CMOS Parallel Pipeline A/D Converter", IEEE Journal of Solid-State Circuits, vol. 36, No. 7, Jul. 2001, pp. 1048-1055.

Van Der Plas, Geert et al., "A 0.16pJ/Conversion-Step 2.5mW 1.25GS/s 4b ADC in a 90nm Digital CMOS Process", ISSCC 2006, Session 31, Very High-Speed ADCs and DACs, 31.1, 2006 IEEE International Solid-State Circuits Conference, Feb. 8, 2006, 10 pages.

Yao, Junjie et al., "Bulk Voltage Trimming Offset Calibration for High-Speed Flash ADCs", IEEE Transactions on Circuits and Systems: Express Briefs, vol. 57, No. 2, Feb. 2010, pp. 110-114.

Miyahara, Masaya et al., "A Low-Noise Self-Calibrating Dynamic Comparator for High-Speed ADCs", IEEE Asian Solid-State Circuits Conference, Nov. 3-5, 2008, pp. 269-272.

\* cited by examiner

INPUT CIRCUIT FOR A DYNAMIC COMPARATOR

CROSS-REFERENCE TO RELATED APPLICATIONS

The present application is a non-provisional patent application claiming priority to European Patent Application No. 16201696.8 filed Dec. 1, 2016, the contents of which are hereby incorporated by reference.

FIELD OF THE DISCLOSURE

The present disclosure is generally related to the field of analog-to-digital converters (ADCs) wherein multi-bit quantizers are used. More in particular, the present disclosure relates to comparators used in such ADCs.

BACKGROUND

Multi-bit quantizers are commonly encountered in flash ADCs, pipeline ADCs etc. High-speed flash ADCs or multi-bit quantizers require fast comparators with a threshold voltage varying over the complete input range of the ADC. The basic architecture is shown in FIG. 1 where all comparators 10, (i=1, . . . , N−1) are identical and compare the sampled input voltage to different threshold voltages $V_{th,i}$ that span a wide input range, e.g., the complete input range of the flash ADC. For simplification, FIG. 1 depicts the single-ended variant rather than the more commonly used differential structure.

When realizing the comparators of FIG. 1, it is desirable that they be operable with a wide range of threshold voltages $V_{th}$ to match the input range with the maximum available voltage range. In recent technologies the supply voltage drops, thus leaving less voltage room on top of a large threshold voltage. An obvious approach could be to provide dedicated comparators for different ranges of threshold voltages. However, this would clearly be an expensive solution.

A general representation of the conventional PMOS input stage of a dynamic comparator is shown in FIG. 2. During the reset phase the switches $SW_{1p}$ and $SW_{1n}$ are closed and the nodes $D_{ip}$ and $D_{in}$ are reset to the electrical ground. During the comparison phase the switch $SW_2$ is closed and the voltages on the nodes $D_{ip}$ and $D_{in}$ increase, building up a voltage difference dependent on the input voltage $V_{in\_p}$-$V_{in\_n}$. Capacitors $C_{Dp}$ and $C_{Dp}$ in FIG. 2 represent the parasitic capacitance on the nodes $D_{ip}$ and $D_{in}$. They can be increased by adding explicit capacitors to achieve low-noise comparators. The latch circuit is triggered when the latch threshold is reached and the difference between the voltages on $D_{ip}$ and $D_{in}$ is large enough to get a decision.

Other solutions can be envisaged. For example, the threshold voltage can be subtracted from the input signal in front of the comparator. The comparator then only has to compare the resulting voltage with a zero threshold. This subtraction is typically done by switching the top plate of the sampling capacitor $C_S$ to the threshold voltage $V_{th}$ before activating the comparator 10 (see FIG. 3). This extra switching operation between the sampling moment and the start of the comparison, required to do the voltage subtraction, limits the speed. The settling time to generate this voltage difference is mainly determined by the switch resistance and the parasitic capacitance at the comparator input. They both should be kept low, which requires large switches and small input transistors of the comparator, which increases the offset and limits the current through the input pair and, hence, the comparator speed. The non-linear parasitic capacitance of the input transistor further results in a non-linear attenuation of the input signal. Finally, there needs to be a capacitive network for each threshold level, which increases the total input capacitance of the ADC.

Another solution to subtract the threshold voltage is to use a second input pair as depicted in FIG. 4. This solution does not impose a speed penalty nor does it increase the total input capacitance or power consumption. Also, this solution ensures both transistors in each of the pairs T1_p, T1_n and T1_p*, T1_n* see more or less the same voltages when the input voltage is substantially similar to that of the threshold. However, this comparator still operates slowly if one of the pairs is cut off, which happens for high threshold voltages. In addition, the common-mode of the input pairs becomes signal-dependent in this configuration. The latter can be solved by putting the reference voltages on one input pair and the input signals on the other. However, this configuration gives the problem that one side of the input pair is cut off while the other one has a large overdrive, making accurate comparison difficult.

The threshold voltage can also be built into the differential structure of the comparator. However, a mismatch can be created by choosing different sizes for the input transistor, different values for the capacitors $C_{Dp}$ and $C_{Dn}$, different voltages of the bulk of the input transistors or by adding compensation current sources. This works for calibrating out relatively small offset values, so that if the input voltage is substantially similar to that of the threshold voltage, both transistors of the input pair have a similar overdrive voltage. However, when a large threshold voltage is desired, one side of the input pair is cut off whereas the other one experiences a large overdrive, making it difficult for the comparator to operate. As a result, these techniques only work for a limited range of threshold voltages.

Hence, there is a need for comparators with an input stage wherein the above-mentioned limitations are avoided or overcome.

SUMMARY

It is an object of embodiments of the present disclosure to provide for an input stage for a dynamic comparator that can handle a wide range of threshold voltages.

The above objective is accomplished by the solution according to the present disclosure.

In a first aspect, the present disclosure relates to an input circuit for a dynamic comparator comprising a positive and a negative branch, whereby each branch comprises a transistor arranged for receiving an input voltage at its gate terminal and a first fixed voltage at its drain terminal via a first switch. The source terminal of the transistor in each of the positive and negative branch is connectable via a second switch to a first plate of a first capacitor in the positive branch and of a second capacitor in the negative branch, respectively, with a second plate of the first capacitor and of the second capacitor being connected to a second fixed voltage. The input circuit is further arranged for receiving a first reset voltage on the first plate of the first capacitor in the positive branch and a second reset voltage on the first plate of the second capacitor in the negative branch, whereby the first and second reset voltages are independent of each other.

The proposed solution indeed allows for appropriately dealing with a wide range of threshold voltages. By providing independently an own voltage to the source terminals of the transistors of the positive and negative branches, both transistors can have the same overdrive voltage for input signals near the threshold voltage without turning one branch off, as is needed in the solutions known in the state of the art.

In one embodiment, the first and the second reset voltages are provided by an external voltage. In another embodiment, the reset voltages are provided via a resistive network in the input circuit. Alternatively, the reset voltages are provided via a capacitive network in the input circuit, for example a charge transfer capacitive network or a DAC.

In yet another embodiment, the reset voltages at the top plates are provided via amplifiers with fixed or tuneable gain values.

In an embodiment, the first capacitor and the second capacitor are implemented as a switchable capacitive network arranged to be precharged to a fixed voltage and switched to generate the first and the second reset voltages.

In an example embodiment, the input circuit comprises a latch circuit arranged for receiving a first output signal from the positive branch and a second output signal from the negative branch. Advantageously the latch circuit is arranged for being triggered when a voltage difference between the output nodes reaches a given threshold level.

In another aspect, the present disclosure relates to a comparator comprising an input circuit as previously described. In yet another aspect the present disclosure relates to an analog-to-digital converter comprising such a comparator.

For purposes of summarizing the present disclosure and the advantages that are achieved, certain objects and advantages of the present disclosure have been described herein above. Of course, it is to be understood that not necessarily all such objects or advantages may be achieved in accordance with any particular embodiment of the present disclosure. Thus, for example, those skilled in the art will recognize that the present disclosure may be embodied or carried out in a manner that achieves or optimizes one advantage or group of advantages as taught herein without necessarily achieving other objects or advantages as may be taught or suggested herein.

The above and other aspects of the present disclosure will be apparent from and elucidated with reference to the embodiment(s) described hereinafter.

BRIEF DESCRIPTION OF THE FIGURES

The present disclosure will now be described further, by way of example, with reference to the accompanying drawings, wherein like reference numerals refer to like elements in the various figures.

DETAILED DESCRIPTION

Figure 1:
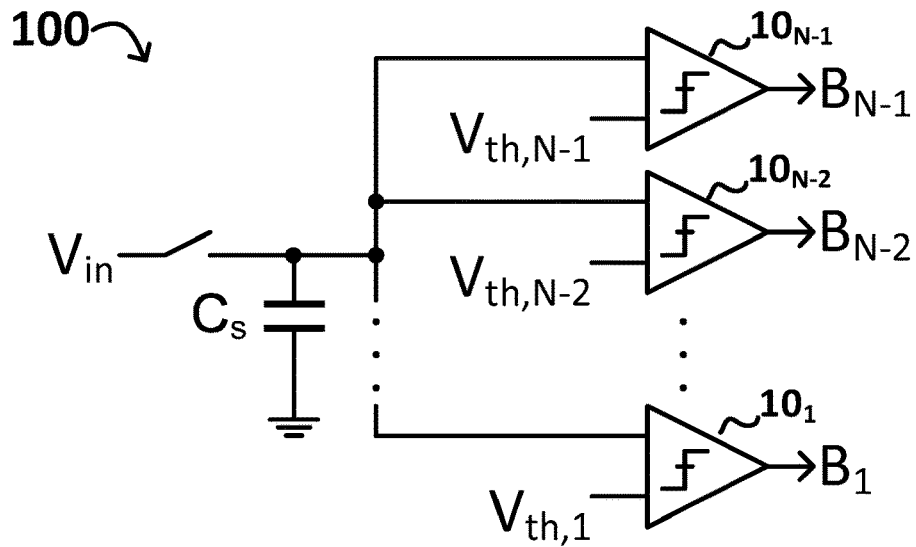
FIG. 1 illustrates a basic multi-bit quantizer architecture with external references for the comparators.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the present disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the present disclosure, various features of the disclosure are sometimes grouped together in a single embodiment, figure, or description thereof for the purpose of streamlining the disclosure and aiding in the understanding of one or more of the various inventive aspects. This method of present disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

The present disclosure proposes an input stage for a dynamic comparator with a simple architecture allowing the use of a single comparator for a wide range of threshold voltages. Further properties of the disclosed circuit comprise:
  small comparison time between sampling moment and a valid comparator result for high-speed applications;
  low power consumption;
  low input capacitance; and
  operation over a wide range of common-mode input values.

The proposed circuit is explained assuming a PMOS input pair, but it can also be applied to comparators with NMOS input pair. A scheme illustrating the general idea behind the proposed comparator is given in FIG. 5. Compared to the conventional solution of FIG. 2, the source node of the differential input pair is split in two nodes $S_{ip}$ and $S_{in}$ and two capacitors $C_{Sp}$ and $C_{Sn}$ are added to these nodes. The top plates are connected to the $S_{ip}$ and $S_{in}$ nodes, while the bottom plates are connected to fixed voltages $V_{2p}$ and $V_{2n}$, respectively. Note that the proposed circuit can also be realized with the top and bottom plates swapped. $C_{Sp}$ and $C_{Sn}$ represent the total capacitances on the nodes $S_{ip}$ and $S_{in}$, respectively, including all parasitic capacitance on these nodes. In the reset mode the top plate voltages of $C_{sp}$ and $C_{sn}$ are reset to independent voltages $V_{hp}$ and $V_{hn}$ depending on the comparator threshold voltage to realize as well as on the common-mode input level of the comparator. Also in the reset mode, the nodes $D_{ip}$ and $D_{in}$ are reset to a fixed voltage $V_1$. During the comparison phase, the switches $SW_{2p}$, $SW_{2n}$ are closed and the voltage on the nodes $D_{ip}$ and $D_{in}$ increases and builds up a difference until the threshold of the latch is achieved and a decision is made.

Figure 5:
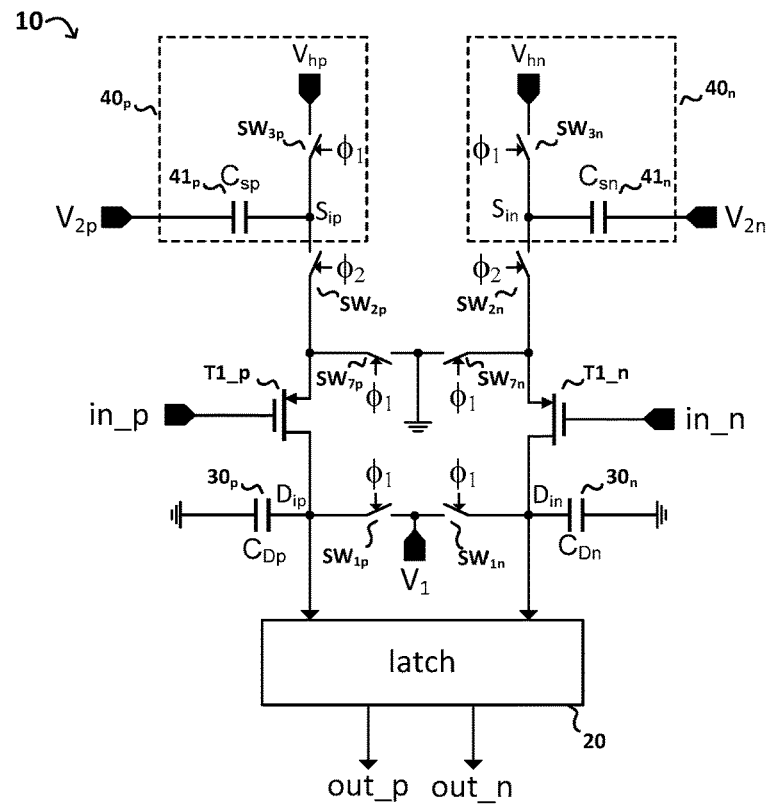
FIG. 5 illustrates an embodiment of an input stage for a dynamic comparator according to the present disclosure using external voltages $V_{hp}$ and $V_{hn}$, according to an example embodiment.

FIG. 5 shows an embodiment where the reset voltages $V_{hp}$ and $V_{hn}$ are provided via switches $SW_{3p}$, $SW_{3n}$. While the source nodes $S_{ip}$ and $S_{in}$ are reset to a high voltage ($V_{hp}$, $V_{hn}$), the drain nodes $D_{ip}$ and $D_{in}$ (with some capacitance $C_D$ comprising the parasitic capacitance and, optionally, an extra capacitor, for example, to lower the noise) are reset to a fixed low voltage $V_1$, usually the electrical ground and in general different from reset voltages $V_{hp}$ and $V_{hn}$. Although the capacitors $C_{Dp}$ and $C_{Dn}$ are usually the same in FIG. 5 and the nodes $D_{ip}$ and $D_{in}$ are reset to the same voltage $V_1$, different capacitors and/or voltages (e.g. $V_{1p}$, $V_{1n}$) might be used, for example to compensate for mismatch errors. During the comparison phase the switches $SW_{2p}$ and $SW_{2n}$ are closed and the voltages on the nodes $D_{ip}$ and $D_{in}$ increase at different rates depending on the input voltage and the high voltages $V_{hp}$, $V_{hn}$. Different implementations may choose to open or close the reset switches $SW_{3p}$, $SW_{3n}$ during this comparison phase. Similar to a conventional dynamic comparator, the latch circuit is triggered when the voltage difference on the nodes $D_{ip}$ and $D_{in}$ is large enough to generate the result of the comparison. In one implementation as in FIG. 5 extra switches $SW_{7p}$ and $SW_{7n}$ are added to the source nodes of the input transistors T1_p, T1_n to connect them to a fixed voltage (for example, the electrical ground) to put these nodes to a fixed voltage, when the switches $SW_{2p}$ and $SW_{2n}$ are open to realize a fixed input capacitance of the comparator while in reset phase.

Figure 2:
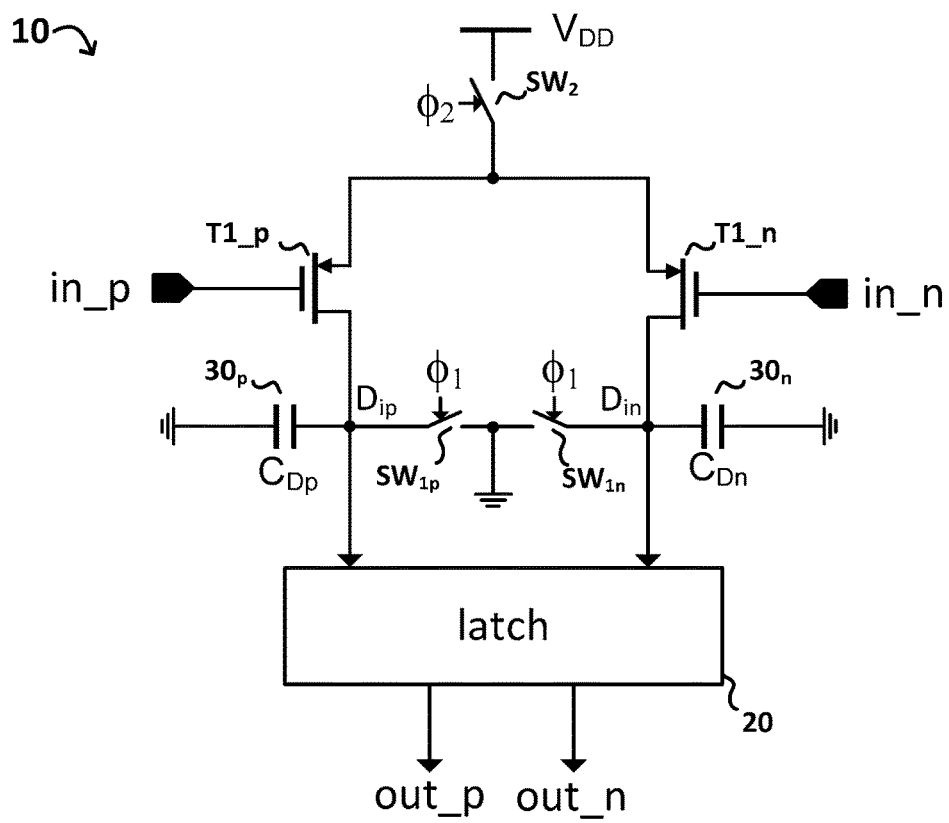
FIG. 2 illustrates a conventional input stage of a dynamic comparator.
Figure 3:
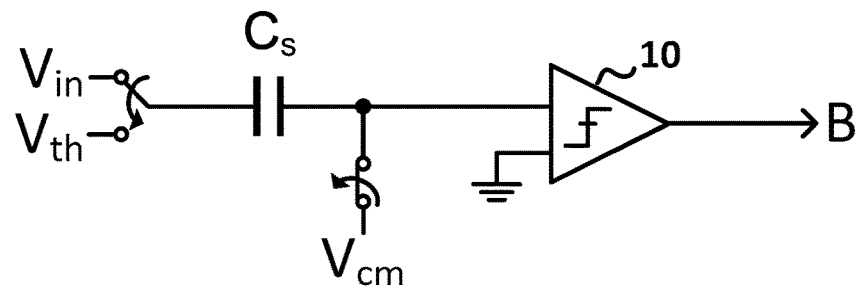
FIG. 3 illustrates an implementation of a subtracting threshold voltage from the input voltage in front of the comparator.
Figure 4:
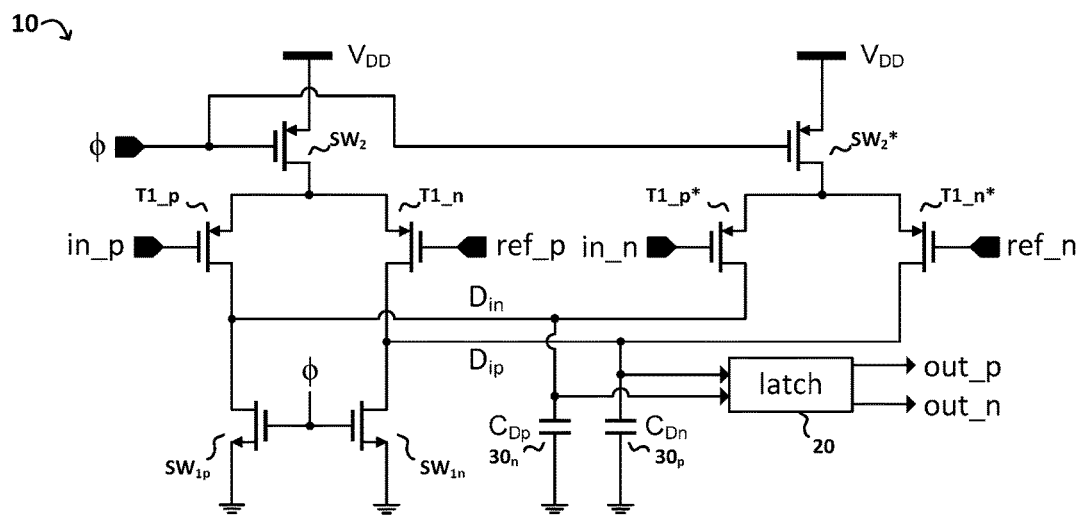
FIG. 4 illustrates a conventional solution wherein an extra input pair is used to subtract the threshold voltage.

The main difference with the conventional input pair of FIG. 2 is the source-gate voltage of the input pair when the input voltage is around the threshold voltage. If $V_{th}$ denotes the comparator threshold voltage and $V_{cm}$ the common-mode input voltage, the input voltages on the positive (P) and negative (N) side are $V_{in\_p} = V_{cm} - V_{th}/2$ and $V_{in\_n} = V_{cm} + V_{th}/2$. In a conventional input structure as in FIG. 2, the source of both PMOS transistors is the same, resulting in one transistor having a large source-gate voltage while the other has a small source-gate voltage. In this input structure the N side would have a source-gate voltage of $(V_{DD} - V_{sd}) - (V_{cm} + V_{th}/2)$ with $V_{sd}$ the required voltage over the top switch (or current source). To avoid turning off one side of the differential pair to obtain accurate comparison around the threshold voltage, this source-gate voltage should be larger than the absolute value of the threshold voltage $V_T$ of the transistor. With a common-mode voltage halfway the supply voltage, this poses an upper limit to the threshold voltage of $V_{DD} - 2V_{sd} - 2V_T$. For example, for a $V_{DD} = 800$ mV and aggressive values for $V_{ds} = 50$ mV and $V_T = 200$ mV, this result in a maximum comparator threshold voltage of 300 mV.

In the proposed architecture, however, the source voltage of each input transistor moves along with the target threshold voltage ensuring both transistors have the same overdrive voltage around the threshold point. As a result, a much wider range of threshold voltages can be realized.

Figure 6:
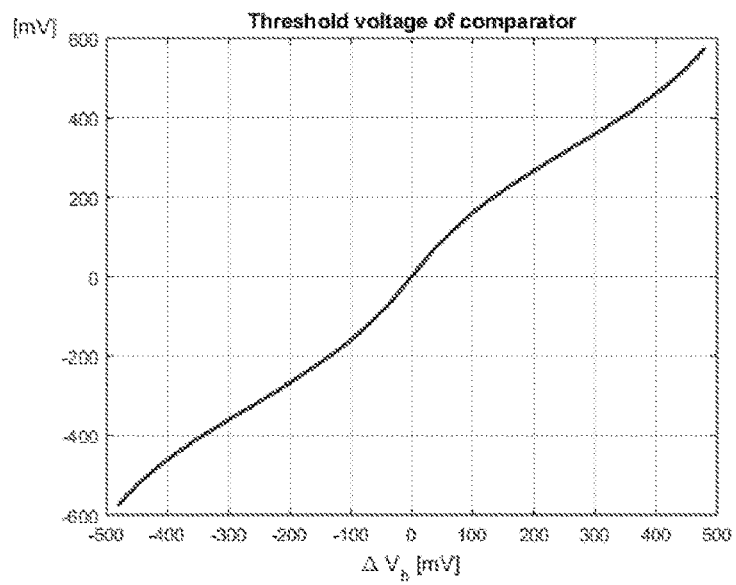
FIG. 6 illustrates an example of wide range of threshold voltages of a dynamic comparator achieved using the proposed input stage circuit, according to an example embodiment.

FIG. 6 shows simulation results of an implementation of the proposed technique in a 16 nm technology with 800 mV supply voltage. The threshold voltage ranges from almost −600 mV to +600 mV. Due to the charge-sharing between the respective capacitors $C_{Sp}$, $C_{Sn}$ and $C_{Dp}$, $C_{Dn}$ the voltages at the source nodes drop during the comparison phase and as a result the threshold voltage of the comparator is somewhat larger than the voltage difference $V_{hp}$–$V_{hn}$ to which $C_{Sp}$ and $C_{Sn}$ are reset.

Another disadvantage of the conventional implementation is that the input common-mode level is limited in the input pair to avoid turning off the transistors of the input pair which would make the comparator very slow. For example, a PMOS input pair with the same values for $V_{sd}$ and $V_T$ as listed above operates for a maximum input common-value of $V_{DD}$−$V_{sd}$−$V_T$−$V_{th}/2$ which becomes 550 mV when no threshold voltage $V_{th}$ is programmed into the comparator. For higher input common-mode values, an NMOS input pair should be used. The input circuit according to this disclosure, however, overcomes this disadvantage as it allows continued use of a PMOS input pair for higher input values by putting the source of the input transistors also higher, which prevents turning them off.

In the embodiment of FIG. 5, the voltages $V_{hp}$ and $V_{hn}$ are available as external voltages. Fixed capacitors $C_{Sp}$ and $C_{Sn}$ are used with a bottom plate connected to yet other external voltages $V_{2p}$, $V_{2n}$, for example the electrical ground. A practical implementation uses some buffer to provide the voltages $V_{hp}$ and $V_{hn}$ to one or more comparators. The time available to precharge the capacitors $C_{Sp}$ and $C_{Sn}$ is usually relaxed since it corresponds to the reset time of the comparator, which is at least equal to the tracking time of the sampler in a typical flash ADC or pipelined ADC. Consequently, the bandwidth of the external circuit (e.g. a buffer) used to provide the voltages $V_{hp}$ and $V_{hn}$ can be small, and small switches $SW_{3p}$, $SW_{3p}$ can be used. As a result, only a small amount of power is required in the external circuits and to toggle the switches.

Figure 7:
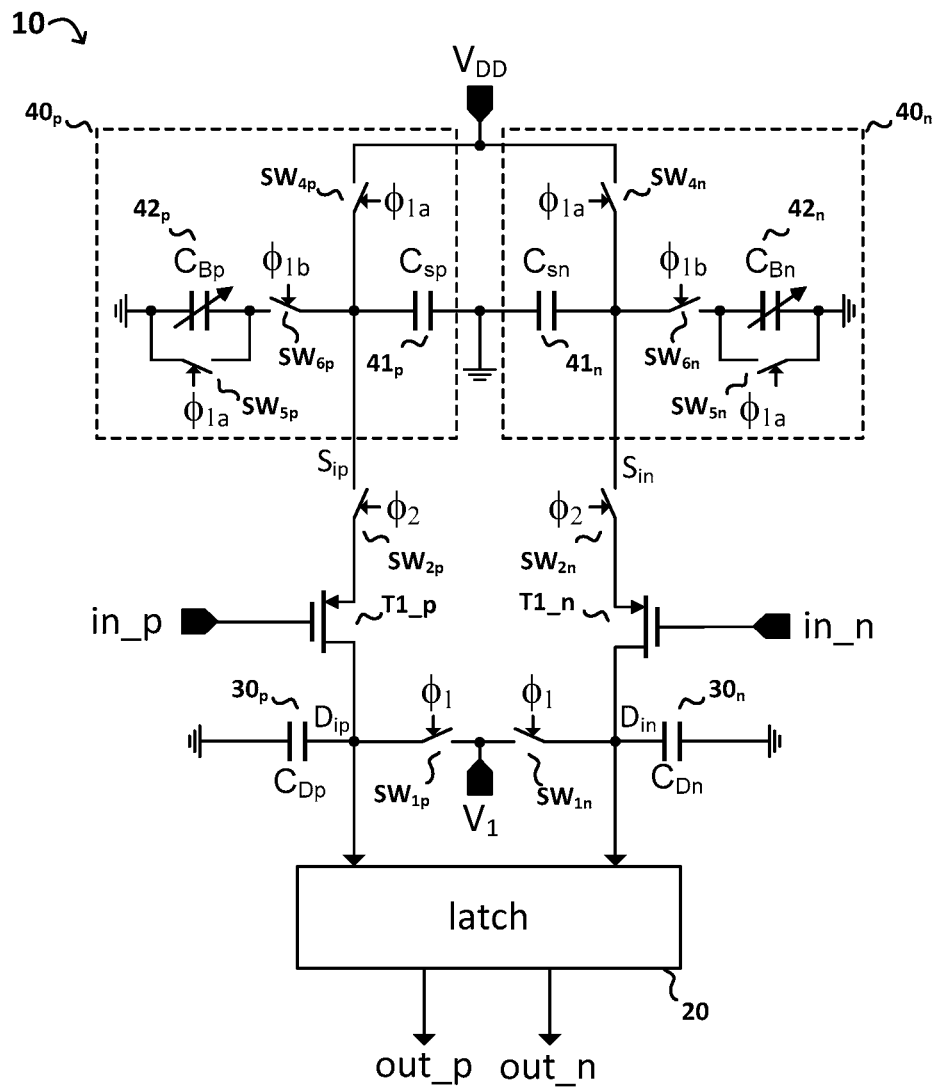
FIG. 7 illustrates an implementation of a dynamic comparator comprising the proposed input stage using a charge-sharing DAC to internally generate the reset voltages $V_{hp}$ and $V_{hn}$ on the top plates of the capacitors $C_{sp}$ and $C_{sn}$, according to an example embodiment.

In other embodiments the voltages $V_{hp}$ and $V_{hn}$ are internally generated. FIG. 7 shows an example of a capacitor network that dynamically generates these voltages by charge-sharing between a fixed capacitor $C_{Sp}$, $C_{Sn}$ with the bottom plate connected to the electrical ground and with the top plate connected to a tuneable capacitor $C_{Bp}$, $C_{Bn}$. This tuneable capacitor is usually built as an array of switchable capacitors. A digital code is used to select the number of capacitors and, hence, the size of $C_{Bp}$, $C_{Bn}$. The reset phase $\phi_1$ is split in two parts wherein during the first reset phase ($\phi_{1a}$) the capacitors $C_{Sp}$ and $C_{Sn}$ are reset to the supply voltage $V_{DD}$ via switches $SW_{4p}$, $SW_{4n}$ and the capacitors $C_B$ are reset to the electrical ground via switches $SW_{5p}$, $SW_{5h}$. Then, during the second reset phase ($\phi_{1b}$), the top plates of $C_{Sp}$ and $C_{Sn}$ are connected to the capacitors $C_{Bp}$, $C_{Bn}$ via switches $SW_{6p}$, $SW_{6n}$ to generate the voltages $V_{hp}$, $V_{hn}$ on the top plates of the capacitors $C_{Sp}$ and $C_{Sn}$. As a result, the reset voltages $V_{hp}$ and $V_{hn}$ are now different from the initial reset voltages $V_{DD}$ and electrical ground. Instead of the supply voltage $V_{DD}$, any fixed voltage can be used, be it lower or higher than $V_{DD}$. For example, any conventional charge pump can be used to generate a voltage higher than $V_{DD}$.

In another implementation, the capacitors $C_{Bp}$ and $C_{Bn}$ are first precharged to fixed voltages and then connected either via the top or the bottom plate to the capacitors $C_{Sp}$, $C_{Sn}$, respectively, with the other plate to a fixed voltage (e.g. the electrical ground) to generate voltages $V_{hp}$ and $V_{hn}$, similar to a charge-sharing DAC. In a fully differential implementation, only one tuneable capacitor $C_B$ is used which is also first precharged to a fixed voltage and then via the top and bottom plates connected to $S_{ip}$, $S_{in}$ or $S_{in}$, $S_{ip}$ to generate $V_{hp}$ and $V_{hn}$.

Figure 8:
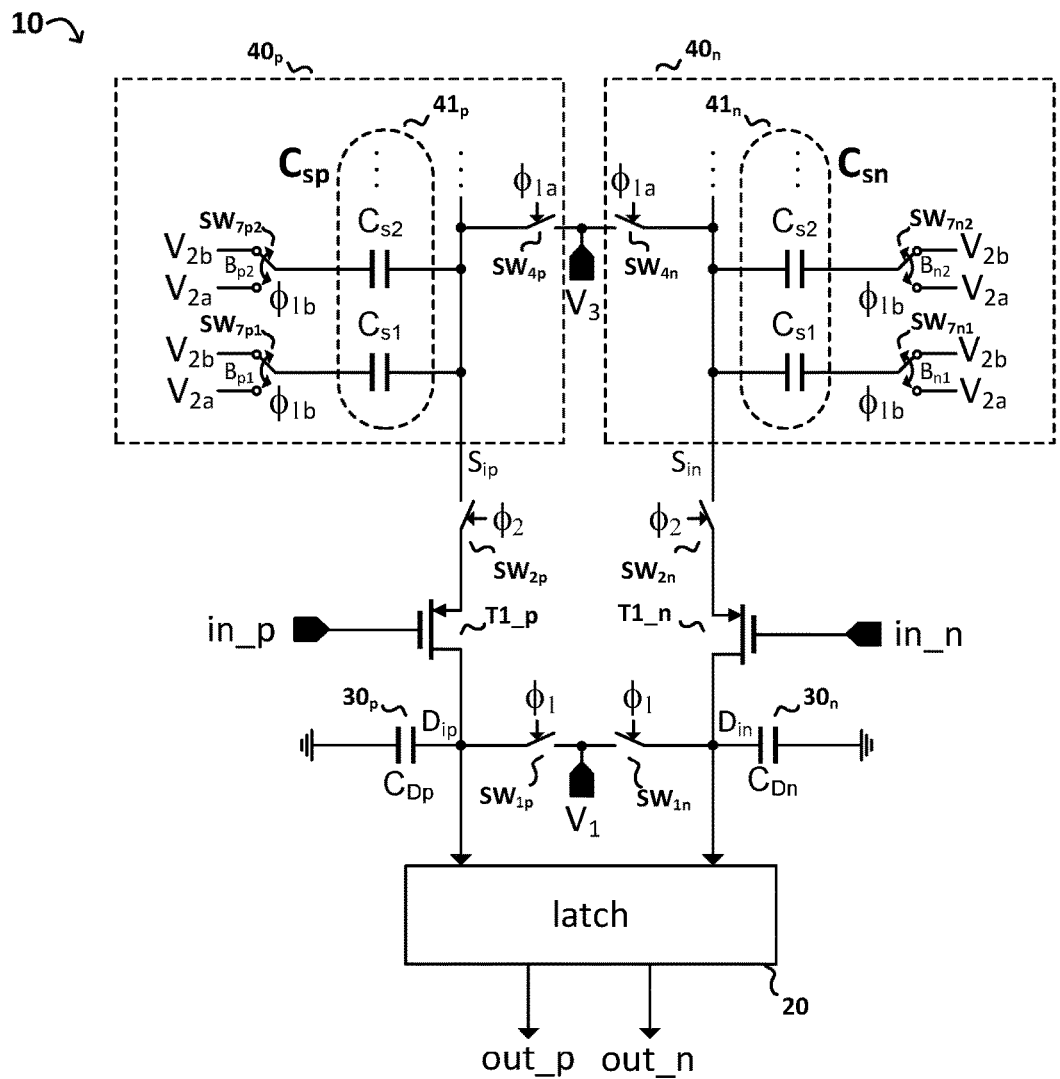
FIG. 8 illustrates an implementation of a dynamic comparator comprising the proposed input stage using a charge-redistribution DAC to internally generate the reset voltages $V_{hp}$ and $V_{hn}$ on the top plates of the capacitors $C_{sp}$ and $C_{sn}$, according to an example embodiment.

Another embodiment is shown in FIG. 8. Here, the fixed capacitors $C_{sp}$ ($41_p$) and $C_{Sn}$ ($41_n$) are both split into a plurality of capacitor units $C_{s1}$, $C_{s2}$ . . . . The bottom plates of these $C_{sp}$ and $C_{Sn}$ can be switched between external voltages $V_{2a}$, $V_{2b}$. During the first reset phase ($\phi_{1a}$), the top plates of the respective capacitors $C_{sp}$, $C_{Sn}$ are reset to a fixed external voltage $V_3$ (e.g., the supply voltage or the common-mode level) while the bottom plates of the units are connected to either $V_{2a}$ or $V_{2b}$. In the second reset phase ($\phi_{1b}$) the bottom plates are switched to generate the reset voltages $V_{hp}$, $V_{hn}$ at the top plates (similarly to FIG. 5, but for simplicity not shown here). The voltages $V_{hp}$, $V_{hn}$ are in general different from the fixed external voltage $V_3$. In one implementation the bottom plates are switched to a higher voltage to generate the $V_{hp}$, $V_{hn}$ voltages higher than $V_{DD}$. Another implementation adds a fixed series capacitor between the common top plate of the capacitors and the source nodes $S_{ip}$, $S_{in}$ to realize effective low values of $C_{sp}$ and $C_{Sn}$ without the need for physically small capacitors, which are very impractical. Smaller capacitors require less energy to be recharged, which may be desirable in low-power applications. Also, when $C_{sp}$ and $C_{Sn}$ are made of units (as in FIG. 8), small capacitors may be desirable to realize a high tuning range resolution without getting a large sum, which would increase the power.

Figure 9:
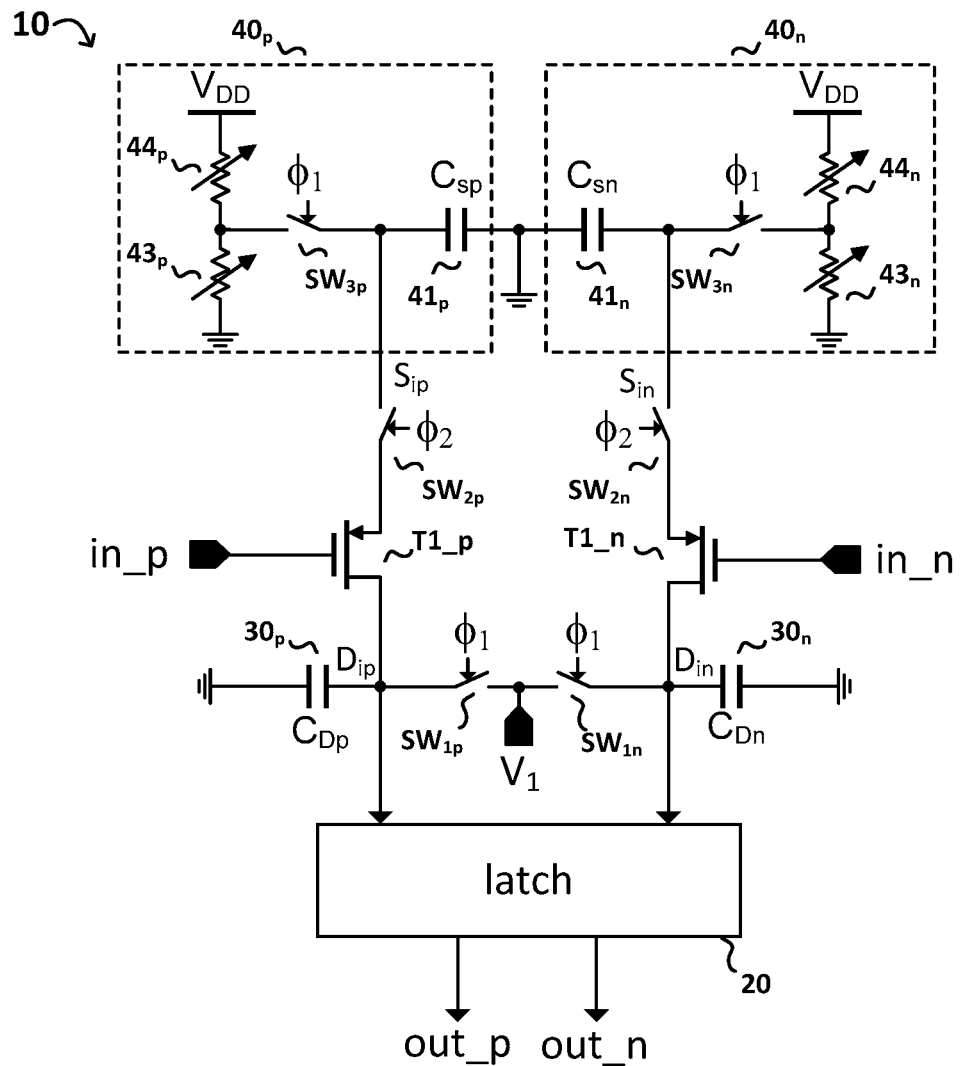
FIG. 9 illustrates an implementation of a dynamic comparator comprising the proposed input stage using a resistive DAC to internally generate the reset voltages $V_{hp}$ and $V_{hn}$ and provide them to the top plates of the capacitors $C_{sp}$ and $C_{sn}$, according to an example embodiment.

In yet another embodiment shown in FIG. 9, the capacitors $C_{sp}$, $C_{Sn}$ are reset via switches $SW_{3p}$, $SW_{3n}$ to nodes of which the voltages ($V_{hp}$, $V_{hn}$) are determined by the ratios of tuneable resistors 43, 44. These resistors can be made tuneable by putting resistor units in parallel or in series. In another implementation a fixed resistor ladder may be used, which generates different reference voltages. Via a network of switches the appropriate reference voltage can then be chosen to be connected to the respective nodes $S_{ip}$, $S_{in}$. By adding tuneable resistors on top and/or bottom of the fixed resistor ladder, an attenuation factor can be applied to all reference voltages, for example, to match an attenuation of the input signal provided to the comparator. In yet another implementation, an R-2R DAC comprising a network of parallel and series resistors, is used to generate the reference voltages which are connected to respective nodes $S_{ip}$, $S_{in}$ via a switch matrix. Since the reset time is usually relaxed, large resistors can be used to limit the static power consumption. In one implementation, switches can be added in the resistive network to turn it completely off during the comparison phase and only activate the resistive network during the reset phase when the voltages $V_{hp}$ and $V_{hn}$ are to be generated.

Figure 10:
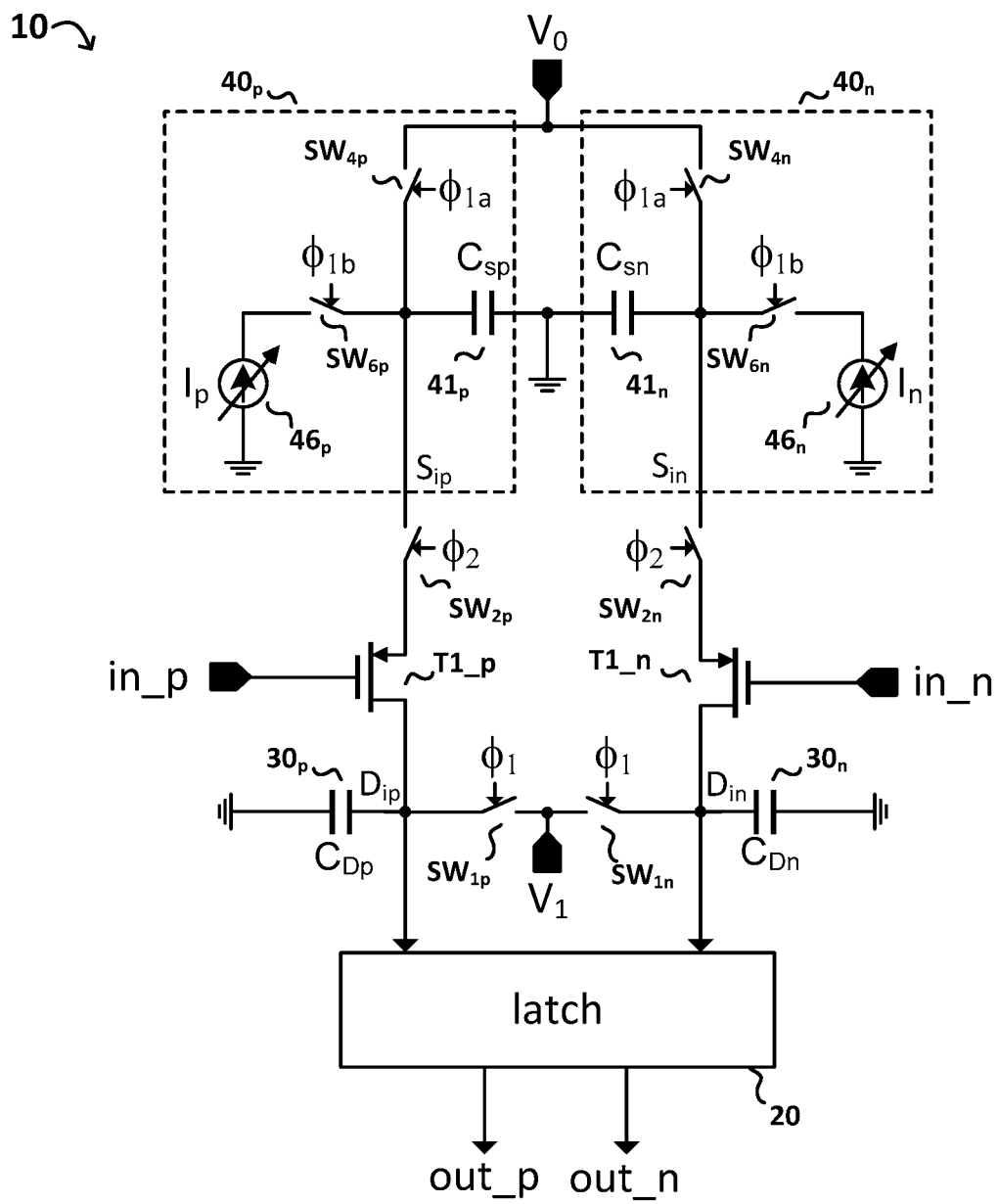
FIG. 10 illustrates an implementation of a dynamic comparator comprising the proposed input stage using a current DAC to internally generate the reset voltages $V_{hp}$ and $V_{hn}$ on the top plates of the capacitors $C_{sp}$ and $C_{sn}$, according to an example embodiment.

The embodiment of FIG. 10 shows the voltages $V_{hp}$ and $V_{hn}$ being generated using current sources which are connected during a fixed time $\phi_{1b}$ to the top plates of capacitors $C_{sp}$ and $C_{Sn}$. During $\phi_{1a}$ these capacitors are first reset to a fixed voltage $V_0$ (like the supply voltage, the electrical ground or the common-mode level, which in general is different from $V_{hp}$ and $V_{hn}$). During the phase $\phi_{1b}$ the current sources are putting a charge proportional to the current value and the time $\phi_{1b}$ onto the capacitors $C_{sp}$, $C_{Sn}$, which increases or decreases the voltages $V_{hp}$, $V_{hn}$ accordingly. Hence, different values are readily generated by using programmable current sources, or by varying the reset time used to generate the voltages $V_{hp}$ and $V_{hn}$.

Figure 11:
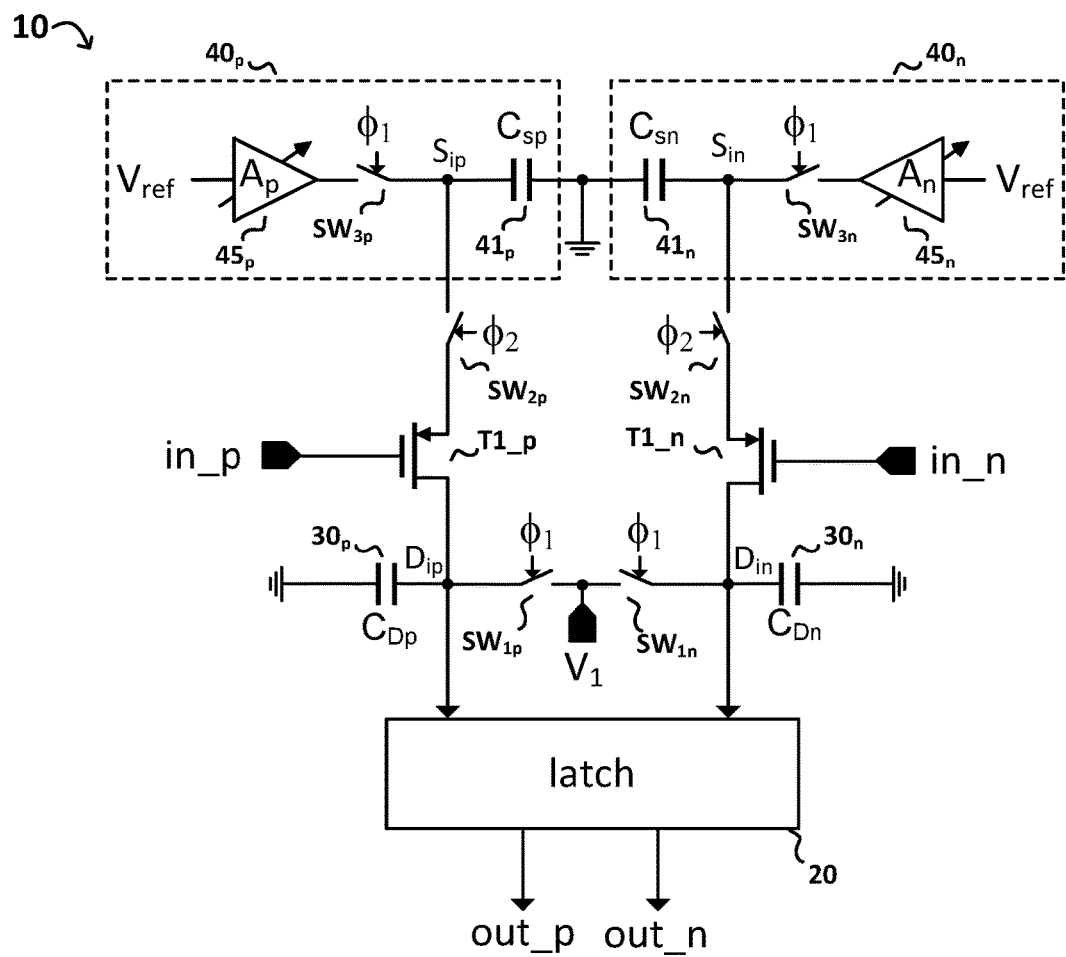
FIG. 11 illustrates an implementation of a dynamic comparator comprising the proposed input stage using a programmable amplifier to internally generate the reset voltages $V_{hp}$ and $V_{hn}$ and provide them to the top plates of the capacitors $C_{sp}$ and $C_{sn}$, according to an example embodiment.

Amplifiers or buffers can also be used to provide the voltages $V_{hp}$ and $V_{hn}$. The embodiment of FIG. 11 shows two amplifiers with a tuneable gain $A_p$, $A_n$, which amplify a fixed reference signal $V_{ref}$ to the different voltages for the positive and negative branches. In one implementation a closed-loop amplifier containing an opamp, operational transconductance amplifier (OTA), switched opamp, ring amplifier or comparator with a resistive or capacitive feedback network, is used to generate different voltages by varying one or more resistors or capacitors. In another implementation an open-loop dynamic amplifier is used with tuneable amplification time to generate the different voltages.

In an embodiment, the circuit according to the present disclosure (as implemented in any of the embodiments shown in FIG. 5 and FIGS. 7 to 11) is used for a coarse tuning of the threshold voltage while a fine tuning is realized conventionally, for example, with tuneable capacitors $C_{Dp}$ and $C_{Dn}$, tuneable current sources at the nodes $D_{ip}$ and $D_{in}$ or tuneable bulk or substrate voltages for the input transistors.

Figure 12:
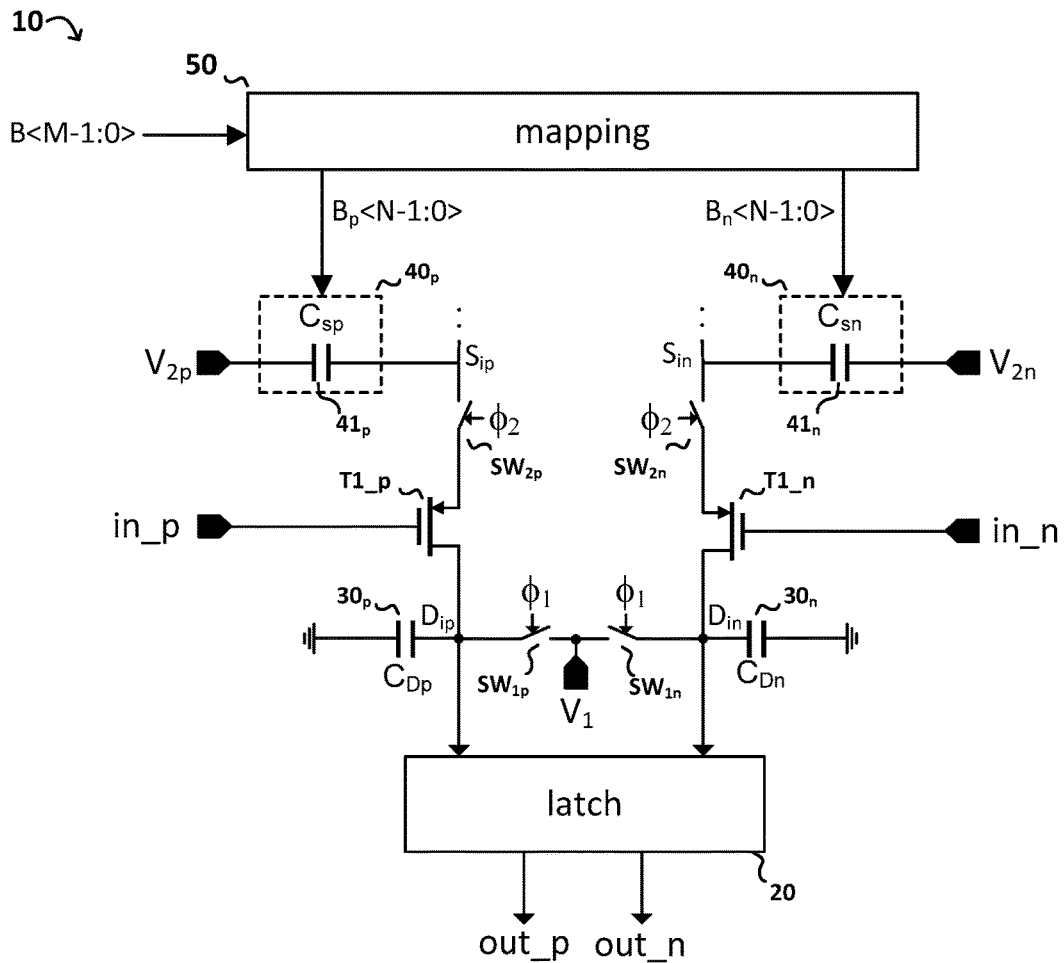
FIG. 12 illustrates an implementation containing a dynamic comparator and mapping circuitry used to tune the threshold of the comparator, according to an example embodiment.
Figure 13:
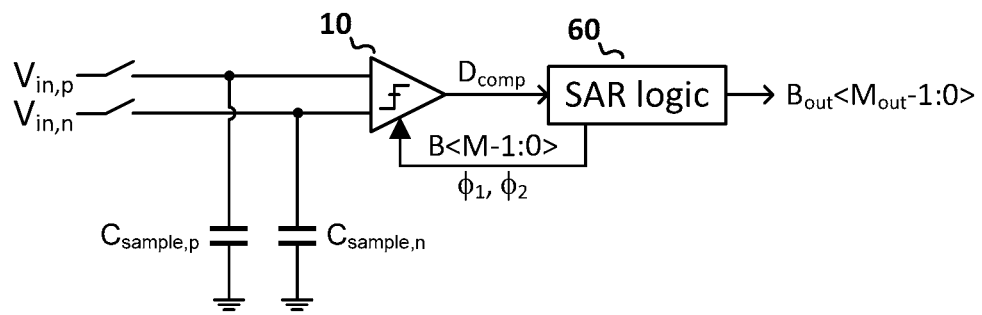
FIG. 13 illustrates an implementation of a SAR ADC containing a dynamic comparator where the threshold voltages are changed during the conversion, according to an example embodiment.
Figure 14:
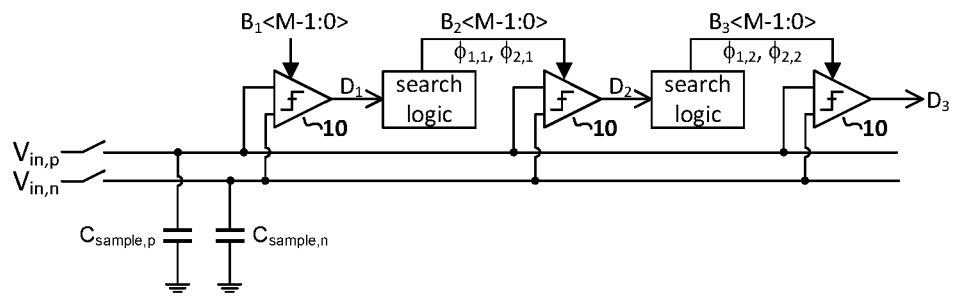
FIG. 14 illustrates an ADC implementation containing multiple dynamic comparators implementing an asynchronous search algorithm, according to an example embodiment.

In one implementation, the input stage contains a mapping circuit, such as a combinatorial logic or a memory block like a look-up table which maps an input M-bit code B<M–1:0> onto two digital N-bit codes $B_p$<N–1:0> and $B_n$<N–1:0> which sets the threshold voltage according to any one of the embodiments mentioned above. FIG. 12 illustrates the use of such mapping circuit 50 in the embodiment of FIG. 5. This configuration with a mapping circuit allows changing the threshold voltage or the common-mode input level during a data conversion algorithm. For example, as shown in FIG. 13, a SAR logic 60 performing a SAR algorithm can be employed where the comparator threshold voltages are adapted in each step rather than the input voltage of the comparator. Another implementation, illustrated in FIG. 14, uses multiple comparators with common input pins, which are subsequently activated, and whereby the threshold voltage of each comparator is set according to the results of the previous comparators. For example, the search logic in FIG. 14 implements an asynchronous binary search algorithm.

In yet another implementation, the outputs of two input stages are combined, for example via resistors, to create interpolated output values which are used to trigger more than two latches. This architecture allows realizing comparisons with interpolated threshold voltages without the need for extra input stages which would increase the power and total input capacitance.

The proposed solution ensures both input transistors see the same source-gate voltage around the threshold of the comparator without turning off one side when a large threshold voltage is required. Also, it allows operation with a wide range of input common-mode levels. For example, PMOS input transistors can be used for a high input level by putting both $V_{hp}$ and $V_{hn}$ at a higher level ensuring the gate-source voltage is large enough for correct operation.

There is no need for a network in front of the comparator to subtract the threshold voltage from the input before comparing which otherwise increase the comparison time, the power and the total input capacitance and introduces non-linear attenuation of the input signal.

The source capacitors $C_{Sp}$, $C_{Sn}$ are precharged to $V_{hp}$, $V_{hn}$ during the reset phase of the comparator, which is not in the critical timing path of typical flash and pipelined ADCs. As a result, there is no speed penalty.

The basic efficiency regarding energy, input capacitance, timing and noise is the same as for the conventional dynamic comparator with the extra functionality of a high threshold available.

To program the threshold voltage into the comparator, a simple calibration routine based can be employed. At the input of the comparator the threshold voltage at the desired common-mode input level is provided and the voltages $V_{hp}$, $V_{hn}$ are varied until the comparator provides an equal numbers of ones and zeros.

While the present disclosure has been illustrated and described in detail in the drawings and foregoing description, such illustration and description are to be considered illustrative or exemplary and not restrictive. The foregoing description details certain embodiments of the present disclosure. It will be appreciated, however, that no matter how detailed the foregoing appears in text, the present disclosure may be practiced in many ways. The present disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. Input circuit for a dynamic comparator comprising a positive and a negative branch, each branch comprising a transistor arranged for receiving an input voltage at its gate terminal and a first fixed voltage at its drain terminal via a first switch characterized in that a source terminal of the transistor in each of the positive and negative branch is connectable via a second switch to a first plate of a first capacitor in the positive branch and of a second capacitor in the negative branch, respectively, with a second plate of the first capacitor and of the second capacitor being connected to a second fixed voltage and the input circuit further being arranged for receiving a first reset voltage on the first plate of the first capacitor in the positive branch and a second reset voltage on the first plate of the second capacitor in the negative branch, the first reset voltage and the second reset voltage being independent of each other.

2. The input circuit for a dynamic comparator as in claim 1, wherein the first reset voltage and the second reset voltage are provided by an external voltage.

3. The input circuit for a dynamic comparator as in claim 1, wherein the first reset voltage and the second reset voltage are provided via a resistive network.

4. The input circuit for a dynamic comparator as in claim 1, wherein the first reset voltage and the second reset voltage are provided via a capacitive network.

5. The input circuit for a dynamic comparator as in claim 1, wherein the first capacitor and the second capacitor are implemented as a switchable capacitive network arranged to be precharged to a fixed voltage and switched to generate the first reset voltage and the second reset voltage.

6. The input circuit for a dynamic comparator as in claim 1, wherein the first reset voltage and the second reset voltage are provided via amplifiers with fixed or tuneable gain values.

7. The input circuit for a dynamic comparator as in claim 1, comprising transistors arranged for acting as current sources to generate the first reset voltage and the second reset voltage.

8. The input circuit for a dynamic comparator as in claim 1, comprising a latch circuit arranged for receiving a first signal output from the positive branch and a second signal output from the negative branch.

9. The input circuit for a dynamic comparator as in claim 8, wherein the latch circuit is arranged for being triggered when a voltage difference between the first signal output and the second signal output reaches a given threshold level.

10. The input circuit for a dynamic comparator as in claim 1, wherein the transistors in the branches are PMOS transistors.

11. The input circuit for a dynamic comparator as in claim 1, wherein the transistors in the branches are NMOS transistors.

12. A comparator comprising an input circuit, the input circuit comprising a positive and a negative branch, each branch comprising a transistor arranged for receiving an input voltage at its gate terminal and a first fixed voltage at its drain terminal via a first switch characterized in that a source terminal of the transistor in each of the positive and negative branch is connectable via a second switch to a first plate of a first capacitor in the positive branch and of a second capacitor in the negative branch, respectively, with a second plate of the first capacitor and of the second capacitor being connected to a second fixed voltage and the input circuit further being arranged for receiving a first reset voltage on the first plate of the first capacitor in the positive branch and a second reset voltage on the first plate of the second capacitor in the negative branch, the first reset voltage and the second reset voltage being independent of each other.

13. The comparator as in claim 12, wherein the first reset voltage and the second reset voltage are provided by an external voltage.

14. The comparator as in claim 12, wherein the first reset voltage and the second reset voltage are provided via a resistive network.

15. The comparator as in claim 12, wherein the first reset voltage and the second reset voltage are provided via a capacitive network.

16. The comparator as in claim 12, wherein the first capacitor and the second capacitor are implemented as a switchable capacitive network arranged to be precharged to a fixed voltage and switched to generate the first reset voltage and the second reset voltage.

17. The comparator as in claim 12, wherein the first reset voltage and the second reset voltage are provided via amplifiers with fixed or tuneable gain values.

18. An analog-to-digital converter comprising:
a comparator including an input circuit for a dynamic comparator comprising a positive and a negative branch, each branch comprising a transistor arranged for receiving an input voltage at its gate terminal and a first fixed voltage at its drain terminal via a first switch characterized in that a source terminal of the transistor in each of the positive branch and the negative branch is connectable via a second switch to a first plate of a first capacitor in the positive branch and of a second capacitor in the negative branch, respectively, with a second plate of the first capacitor and of the second capacitor being connected to a second fixed voltage and the input circuit further being arranged for receiving a first reset voltage on the first plate of the first capacitor in the positive branch and a second reset voltage on the first plate of the second capacitor in the negative branch, the first reset voltage and the second reset voltage being independent of each other.

19. The analog-to-digital converter as in claim 18, wherein the first reset voltage and the second reset voltage are provided by an external voltage.

20. The analog-to-digital converter as in claim 18, wherein the first reset voltage and the second reset voltage are provided via a resistive network.

* * * * *